(12) United States Patent
Bernkopf et al.

(10) Patent No.: US 6,762,128 B2
(45) Date of Patent: Jul. 13, 2004

(54) APPARATUS AND METHOD FOR MANUFACTURING A SEMICONDUCTOR CIRCUIT

(75) Inventors: Paul A. Bernkopf, Arlington, VA (US); Frederick T. Brady, San Antonio, TX (US); Nadim Haddad, Oakton, VA (US)

(73) Assignee: BAE Systems, Nashua, NH (US)

( * ) Notice: Subject to any disclaimer, the term of this patent is extended or adjusted under 35 U.S.C. 154(b) by 0 days.

(21) Appl. No.: 10/177,915

(22) Filed: Jun. 20, 2002

(65) Prior Publication Data

US 2002/0182884 A1 Dec. 5, 2002

Related U.S. Application Data

(62) Division of application No. 09/590,809, filed on Jun. 9, 2000.

(51) Int. Cl.$^7$ .............................................. H01L 21/302
(52) U.S. Cl. .................. 438/704; 438/694; 438/702; 438/717; 438/725; 438/692; 438/724; 438/723
(58) Field of Search ................................. 438/692, 693, 438/723, 724, 725, 717, 704, 694, 702

(56) References Cited

U.S. PATENT DOCUMENTS

| 6,033,970 A | * | 3/2000 | Park .......................... 438/435 |
| 6,037,018 A | * | 3/2000 | Jang et al. .................. 427/579 |
| 6,339,004 B1 | * | 1/2002 | Kim ........................... 438/296 |

* cited by examiner

Primary Examiner—George A. Goudreau
(74) Attorney, Agent, or Firm—DeMont & Breyer, LLC

(57) ABSTRACT

A method and an apparatus for manufacturing, via a single fabrication line, circuits that are radiation tolerant and also circuits that are radiation intolerant. When production calls for radiation-tolerant circuits, low-pressure chemical vapor deposition is advantageously used to deposit an electrically-insulating material, such as silicon dioxide, in trenches to provide electrical isolation between adjacent semiconductor devices. When production requires radiation-intolerant circuits, as may be required for export, then the trenches are filled via a procedure that deposits an electrically-insulating material that, on exposure to ionizing radiation, generates a suitably large amount of "positive charge traps." One procedure suitable for creating such positive charge traps is high-density plasma chemical vapor deposition (HDPCVD).

18 Claims, 6 Drawing Sheets

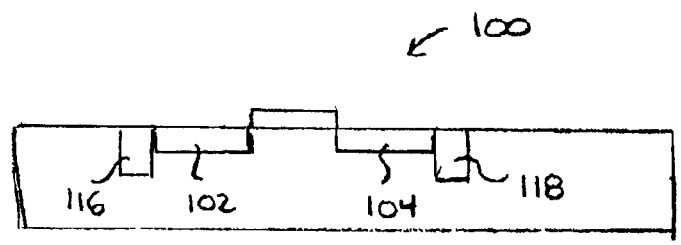
FIG. 1
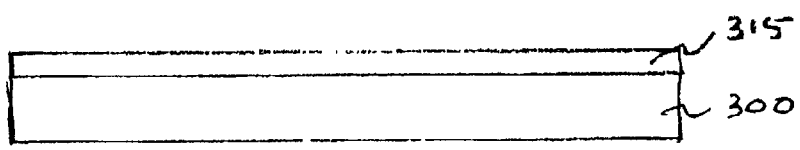
FIG. 3
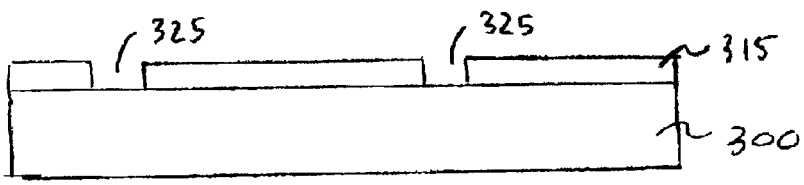
FIG. 4
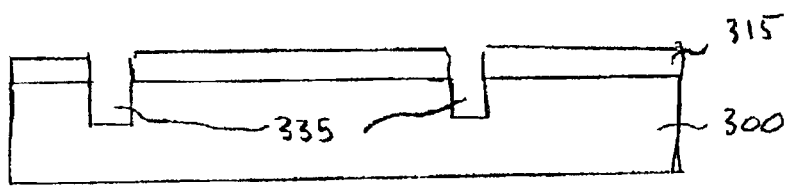
FIG. 5
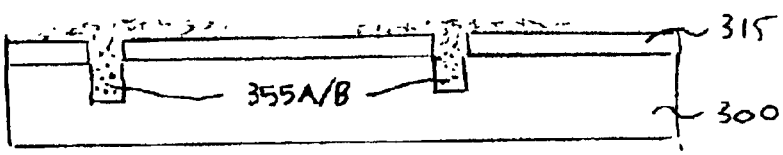
FIG. 6
FIG. 7
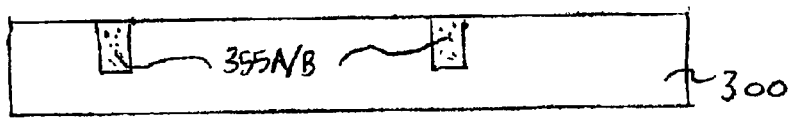

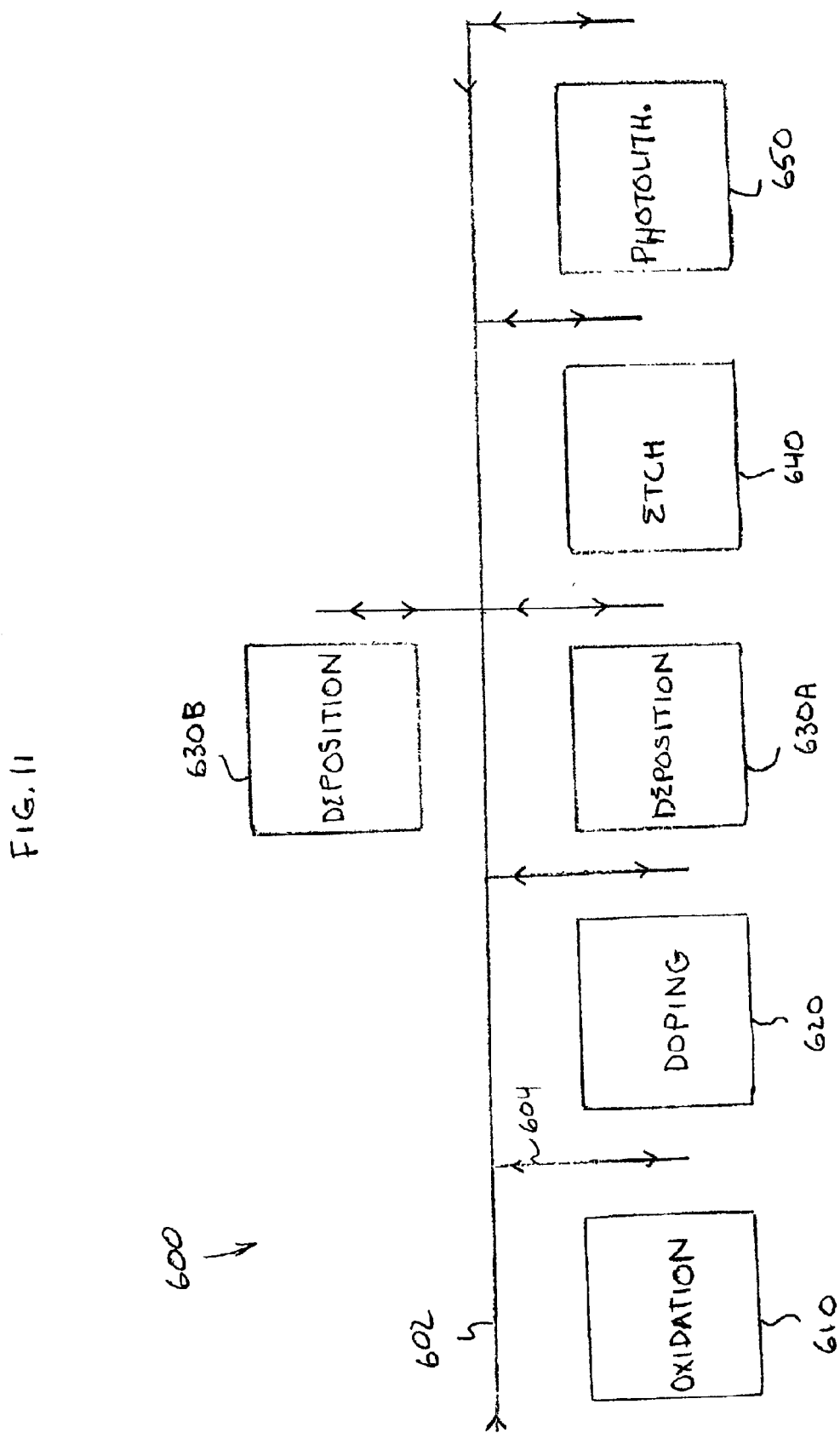

APPARATUS AND METHOD FOR MANUFACTURING A SEMICONDUCTOR CIRCUIT

This case is a division of, and claims priority of, co-pending U.S. patent application Ser. No. 09/590,809 filed Jun. 9, 2000.

FIELD OF THE INVENTION

The present invention relates to semiconductor processing. More particularly, the present invention relates to an apparatus and a method for tailoring the total ionizing (radiation) dose (TID) tolerance of semiconductor devices and circuits.

BACKGROUND OF THE INVENTION

State-of-the-art integrated circuits ("ICs") consist of hundreds of thousands or even millions of transistors and other devices. The spacing between adjacent transistors in such circuits is quite small and electrical leakage between devices does occur. Isolation structures are therefore required to block such leakage currents.

Local oxidation of silicon processes ("LOCOS") are often used in the fabrication of ICs to provide electrical isolation. LOCOS may not, however, be the preferred isolation method for high-device-density, state-of-the-art ICs. In particular, due to its characteristic "bird's beak" spur, LOCOS uses a relatively large amount of chip "real estate." Rather, a technique called shallow trench isolation ("STI"), which uses less chip real estate, is preferred.

The use of STI is illustrated in FIG. 1, wherein two "shallow" trenches 116 and 118 are employed to electrically isolate a field effect transistor (FET) 100 from adjacent devices (not shown). To provide such isolation, the trenches are filled with an electrically-insulating material, such as silicon dioxide. As depicted in FIG. 1, the trenches flank FET 100, wherein trench 116 is to the "left" of drain 102, and trench 118 is to the "right" of source 104.

In the past, complementary metal oxide semiconductor ("CMOS") processes that incorporated LOCOS-based field isolation and thick "gate oxides" for producing transistors and other devices required special steps to "harden" such devices to ionizing radiation, as is important in aerospace and defense applications. Such ionizing radiation, either from natural or man-made sources, can damage or destroy semiconductor devices. Radiation changes the electrical properties of solid state devices, leading to the possible failure of any system incorporating them. "Radiation hardness" refers to the ability of a semiconductor device to withstand radiation without alteration of its electrical properties. A semiconductor device is termed "radiation hard" ("rad-hard"), "radiation tolerant" or "radiation resistant" if it can continue to function within specifications after exposure to a specified amount of radiation.

Ionizing radiation is one agent that damages or destroys CMOS devices. Ionizing radiation is caused by photon (gamma or x-ray) interactions, fast neutron interactions and charged (alpha and beta) particles. As ionizing radiation is absorbed by a transistor, there is a buildup of positive charge, referred to as "positive charge trapping," in the field oxide near the silicon-silicon dioxide interface. This charge can interfere with the performance of P-channel devices such as by increasing the threshold voltage, reducing transistor drive current, and reducing speed. In N-channel devices, positive oxide charge causes an inversion of the substrate surrounding the active regions, providing an unwanted current path.

Further discussion of the effects of ionizing radiation on semiconductor devices is provided in applicant's co-pending cases; "Increasing the Susceptibility of Integrated Circuits to Ionizing Radiation" (Docket No. FE-00439); "Semiconductor Circuit Having Increased Susceptibility to Ionizing Radiation" (Docket No. FE00442); and "Semiconductor Device and Circuit Having Low Tolerance To Ionizing Radiation" (Docket No. FE00443), all of which are incorporated by reference herein.

As CMOS technology has scaled to smaller dimensions (i.e., 0.25 micron ground rules and less), the gate oxide has thinned to the point where, by virtue of such thinness, it is inherently relatively impervious to the effects of ionizing radiation. Moreover, as LOCOS is supplanted by STI, the radiation-susceptible semi-thick "bird's beak" region under the polysilicon gate of a transistor is no longer present.

As a result, state-of-the-art ICs utilizing STI are much more tolerant to ionizing radiation than ICs utilizing LOCOS. In fact, such circuits may be radiation hardened to the point where Department of Defense export restrictions may be implicated. To the extent that a commercial CMOS fabricator is restricted from freely exporting its chips, it suffers financially. The art would therefore benefit from an IC that possesses that benefits of contemporary processing technologies yet is advantageously susceptible to ionizing radiation.

SUMMARY OF THE INVENTION

A method and an apparatus for manufacturing, via a single fabrication line, circuits that are relatively tolerant to ionizing radiation and also circuits that are relatively intolerant to ionizing radiation, are disclosed.

In accordance with the present invention, when production calls for radiation-intolerant circuits, a method is used to deposit an insulator that generates a relatively large amount of "positive charge traps" when exposed to ionizing radiation. One method that is suitable for depositing such an insulator is high-density plasma chemical vapor deposition (HDPCVD).

Alternatively, when a radiation-tolerant circuit is desired, a method is used to deposit an insulator that generates relatively fewer "positive charge traps" when exposed to ionizing radiation. Low-pressure chemical vapor deposition (LPCVD) is advantageously used for this purpose. In a further embodiment, plasma-enhanced chemical vapor deposition (PECVD) is used to deposit the insulator for a radiation-tolerant circuit.

The mechanisms by which such oxides impart radiation tolerant and intolerance to such semiconductor devices is described later in this Specification.

One illustrative embodiment of the present invention is an apparatus comprising: trench-forming systems that are collectively operable to form a trench in a wafer; a first processing system operable to deposit an electrically-insulating material in the trench suitable for forming a radiation-tolerant circuit; and a second processing system operable to deposit an electrically-insulating material in the trench suitable for forming a radiation-intolerant circuit. In a first variation of the first illustrative embodiment, the apparatus further comprises a delivery system operative to deliver the wafer to the trench-forming systems, the first processing system and the second processing system.

A second illustrative embodiment of the present invention is an apparatus for fabricating radiation-intolerant and radiation tolerant circuits, comprising: a high-density plasma chemical vapor deposition (HDPCVD) system; and a low-pressure chemical vapor deposition (LPCVD) system. In a first variation of the second illustrative embodiment, the apparatus further comprises a delivery system that is operable to selectively transport the wafer to the HDPCVD system when fabricating the radiation intolerant circuits; and operable to selectively transport the wafer to the LPCVD system when fabricating the radiation tolerant circuits.

A further illustrative embodiment of the present invention is a method for manufacturing radiation tolerant and radiation intolerant circuits in a single fabrication line, the method comprising: forming a trench in a wafer; directing the wafer to one of two systems for filling the trench, as follows: to manufacture a radiation tolerant circuit, to a first system that is operative to deposit an electrically insulating material that, on exposure ionizing radiation, generates an insufficient amount of positive charge trapping centers in said electrically insulating material to render a circuit incorporating same radiation intolerant. To manufacture a radiation intolerant circuit, the wafer is directed to a second system that is operative to deposit an electrically-insulating material that, on exposure to ionizing radiation, generates a sufficient amount of positive charge trapping centers in the electrically-insulating material to render a circuit incorporating same radiation intolerant.

BRIEF DESCRIPTION OF THE DRAWINGS

FIG. 1 depicts the use of shallow-trench-isolation to isolate devices.

FIGS. 3–7 depict a cross-section of a wafer at various stages of fabrication in accordance with the illustrative method of FIG. 2.

FIG. 11 depicts an illustrative fabrication apparatus suitable for implementing the inventive method.

DETAILED DESCRIPTION

In some embodiments, the present invention provides a method and an apparatus for manufacturing, via a single fabrication line, either radiation tolerant or radiation intolerant devices and/or circuits (hereinafter, simply "circuits").

For clarity of explanation, the illustrative embodiments of the present invention are presented as comprising individual "operational" blocks. The functions or operations that these blocks represent are provided via various well-known processing techniques and devices, including, for example, photolithography and chemical vapor deposition. As such techniques and devices are well understood by those skilled in the art, they will be referenced without description as appropriate.

The energy transferred to a material by ionizing radiation is measured in rads (radiation absorbed dose). One rad is equal to the energy of 100 ergs per gram of material. The material must be specified, because this energy will differ with each material. The ionizing dose rate for silicon-based semiconductors is referred to in rads(Si)/sec.

As used herein, the term "radiation tolerant" and "radiation hard" refer to circuits having a total ionizing dose (TID) tolerance in the range of about 50 to about 200 Krad (Si). The terms "radiation intolerant," "radiation susceptible" or "radiation soft" refer to circuits having a maximum TID tolerance less than about 50 Krad (Si), and typically exhibit such intolerance at a TID as low as about 1 to 3 Krad (Si).

Figure 2:
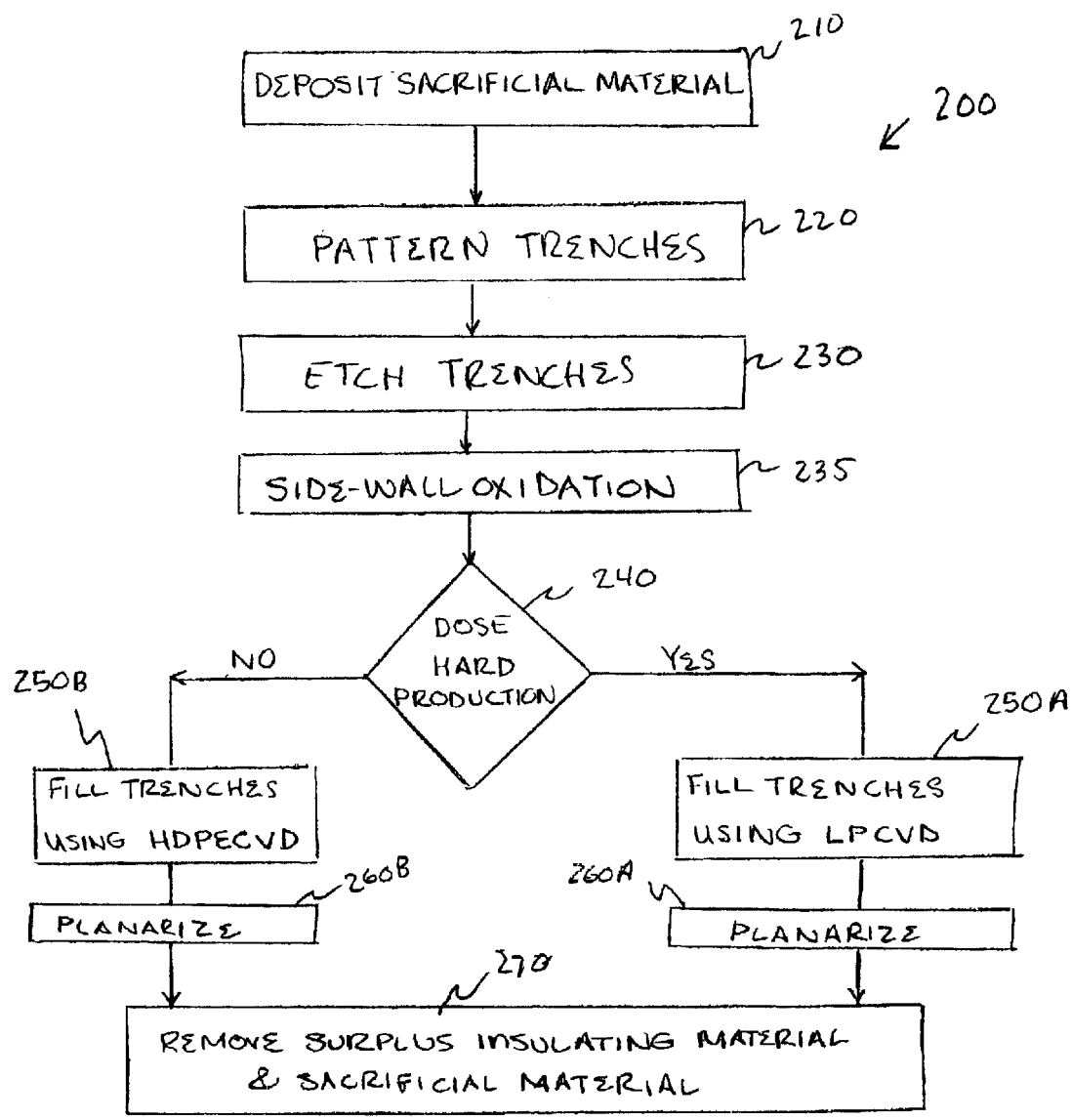
FIG. 2 depicts a flow diagram of a method for fabricating both dose-hard or dose-soft structures in accordance with an illustrated embodiment of the present invention.

FIG. 2 depicts a method 200 for manufacturing semiconductor circuits in accordance with an illustrated embodiment of the present invention. FIGS. 3–7 depict a cross-section of a wafer at various stages of processing in accordance with method 200.

In operation 210, a layer 315 of a sacrificial dielectric material (e.g., silicon nitride, silicon dioxide) is applied to the surface of a clean wafer 300 (see FIG. 3). Subsequently in operation 220, openings 325 are patterned through layer 315 to expose the surface of the wafer 300 in preparation for etching "trenches" (see FIG. 4). Openings 325 can range widely in size as a function of the "feature" size of chip. In fact, openings 325 can have dimensions in a range from the minimum feature size of the fabrication process (both length and width) to as large as several hundred microns.

With the desired regions of wafer 300 exposed, trenches 335 are etched in the wafer in operation 230 (see FIG. 5). Reactive ion etching ("RIE") is advantageously used to etch trenches 335, although other dry-etch methods, such as plasma etching or ion milling may suitably be used. Trenches 335 are etched to a depth that is in a range from about 0.3 to about 0.6 microns. More generally, the trenches should be significantly deeper (e.g., by a factor of about four) than the features of the device that such trenches are meant to isolate.

In operation 235, a "sidewall" oxidation is performed, wherein a thin layer of silicon dioxide is deposited along the walls of trenches 335. The thickness of the deposited oxide layer is in a range of about 50 to about 300 angstroms. The side-wall oxidation is performed using thermal oxidation.

Operations 210 through 235 are common to both modes of operation (i e., are used to fabricate both radiation-tolerant and radiation-intolerant circuits). Before carrying out the next processing operation—depositing an electrically-insulating material within the trench—the fabrication method diverges along two different lines, since different deposition techniques are required as a function of whether radiation-tolerant or radiation-intolerant circuits are required.

Before addressing the differences in the manner in which the deposition step is carried out as between the two operating modes, several similarities are first described. In particular, regardless of the operating mode, chemical vapor deposition (CVD) processes (described further below) are advantageously used in the illustrated embodiments for depositing materials that function as electrically-insulating materials.

Moreover, silicon dioxide is advantageously used as the electrically-insulating material. The preferred source for the silicon is tetra ethyl orthosilicate, commonly known as "TEOS." It is known, however, to use other deposition methods, other electrically-insulating materials and other silicon sources, and those skilled in the art will be able lo use such alternatives in other embodiments of the present invention.

Returning to method 200, in operation 240, a decision is made as to operating mode—the production of radiation-tolerant or radiation-intolerant circuits. When radiation-tolerant circuits are desired, a technique is used to form an oxide layer in operation 250A that results in substantially no leakage current when the circuit is exposed to ionizing radiation at a TID less than about 50 Krad (Si).

In one embodiment, low-pressure CVD (LPCVD) is advantageously used in operation 250A to deposit an electrically-insulating material 355A in trenches 335. In another embodiment, standard plasma-enhanced CVD (PECVD) can be used, although fill characteristics of an oxide deposited by PECVD may be interior to LPCVD.

Alternatively, when radiation-intolerant circuits are desired, an oxide is formed in operation 250B that results in an unacceptably-large leakage current when the circuit absorbs a TID of less than about 50 Krad (Si). One way to do this is to deposit an oxide that generates a relatively large amount of "positive charge traps" on exposure to ionizing radiation. In one embodiment, high-density plasma CVD (HDPCVD) is advantageously used in operation 250B to deposit an electrically-insulating material 355B in trenches 335.

By way of background, in normal CVD, the chemical reaction (e.g., $Si(OC_2H_5) \rightarrow SiO_2$) is driven by the temperature of the substrate. For most reactions, this temperature is high (i e., greater than 800° C.). The high substrate temperature precludes the use of this method in a number of applications, including microelectronics. In LPCVD, the reactions are carried out at lower temperatures (e.g., about 400–700° C.) so that the process is compatible for use in microelectronics applications. In PECVD, plasma is used to dissociate and activate the chemical gas so that the substrate temperature can be further reduced to about 300° C.

HDPCVD is often used for the manufacture of state-of-the-art ICs. The high-density plasma produced from this process, measured as the number of electrons or ions per cubic centimeter, is particularly effective in filling the smaller spaces and higher aspect ratio gaps characteristic of state-of-the-art ICs. Several plasma sources are suitable for generating such high-density plasmas. Such sources include, without limitation, a parallel-plate plasma source (a RF [typically 13.56 MHz] power source is used for plasma generation); electron cyclotron resonance (a microwave [2.45 GHz] power source is used for plasma generation); and inductive coupling plasma source (an inductively coupled RF [typically 13.56 MHz] power source is used for plasma generation). HDPCVD processes are commercially available from Novellus Systems, Inc. of San Jose, Calif. (www.Novellus.com) and Watkins-Johnson Company of Palo Alto, Calif. (www.wj.com), among others.

In the operation of a HDPCVD process, a RF bias is applied to a wafer substrate in a reaction chamber that is filled with a gas mixture containing oxygen, silane and inert gases (e.g., argon, etc.). Some of the gas molecules are ionized in the plasma and accelerate toward the wafer surface when an RF bias is applied to the substrate. CVD processes are well understood and those skilled in the art and will know how to implement them in conjunction with the present invention. See, for example, P. Van Zant, *Microchip Fabrication: A Practical Guide to Semiconductor Processing*, (3d. Ed., McGraw Hill, 1997) at p.355–385. For HDPCVD, see U.S. Pat. Nos. 5,968,610; 5,944,902; 5,937,323; 5,872,058; 5,865,896; 5,846,883; 5,814,564; 5,614,055; 5,540,800; 5,429,070 and 5,397,962. The above publications are incorporated by reference herein in their entirety.

In the context of the present invention, HDPCVD is used for a reason other than its ability to fill high-aspect ratio gaps. In particular, as previously indicated, HDPCVD produces an oxide that generates a relatively large amount of "positive charge traps" when exposed to ionizing radiation. The physical phenomena that causes such charge trapping, and radiation susceptibility, is described below with reference to a conventional n-channel FET.

Figure 12A:
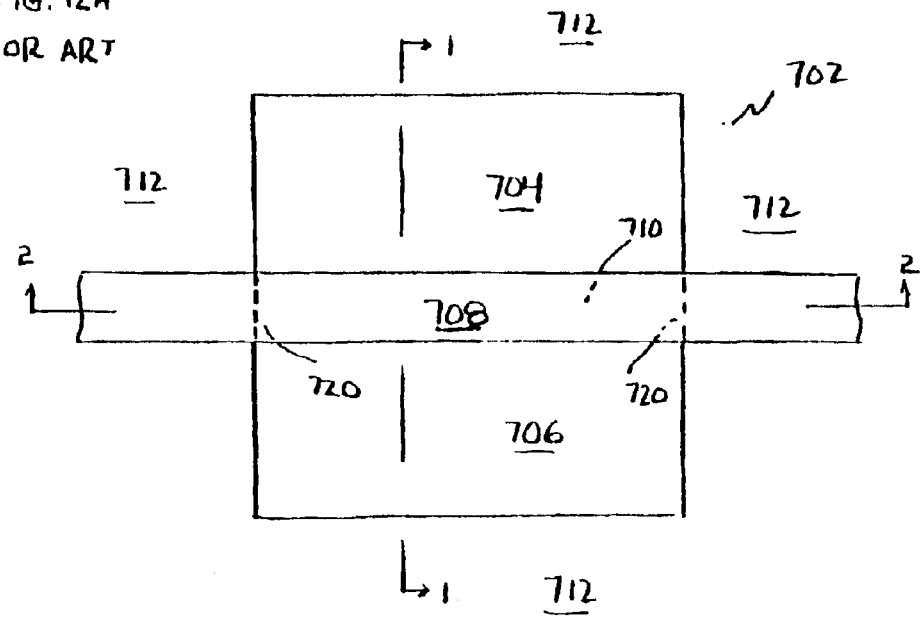
FIGS. 12A–12C depict a n-channel transistor in the prior art.

FIG. 12A depicts, via plan view, n-type drain region 704, n-type source region 706 and gate electrode 708 (typically polysilicon). Gate electrode 708 lies over a channel region 710 between drain region 704 and source region 706. Drain region 704 and source region 706 are bounded by field oxide (e.g., silicon dioxide) 712 at regions remote from gate electrode 708.

Figure 12B:
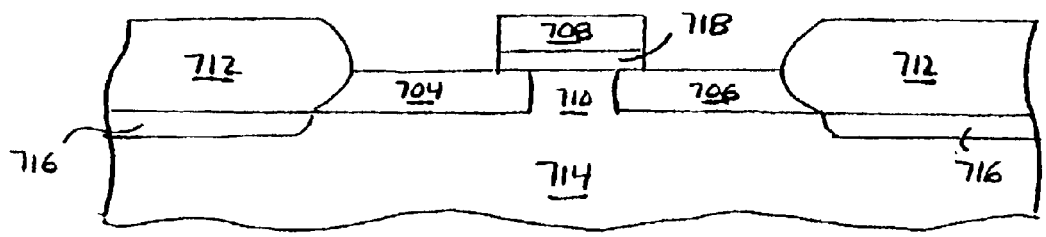

FIG. 12B is a cross-section of transistor 702 along line 1—1 (shown in FIG. 12A) as viewed in the direction indicated. FIG. 12B shows the "operating" transistor in p-type substrate 714. Gate electrode 708 overlies gate dielectric (e.g., silicon dioxide) 718.

Figure 12C:
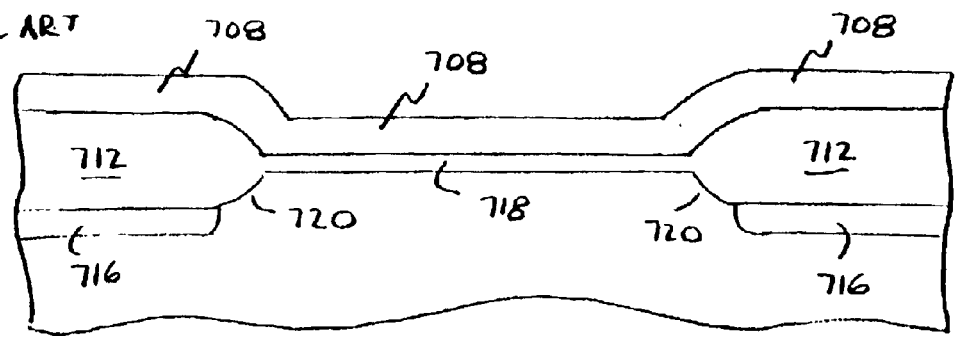

A parasitic transistor having field oxide 712 as a gate dielectric is present in transistor 702 along the side walls of field oxide 712 at regions 720 at which gate electrode 708 extends over the edge of field oxide 712. (See FIG. 12C, which depicts a cross-section of transistor 702 along line 2—2 in FIG. 12A as viewed in the direction indicated; see also FIG. 12A.) This parasitic transistor will normally be in a non-conductive state since field oxide 712 is significantly thicker than gate dielectric 718. As such, the parasitic transistor will be off when the operating transistor is off. When the operating transistor is turned on, effectively all of the source-to-drain conduction will flow in the channel under gate dielectric 718, such that the parasitic transistor is non-conducting. Moreover, p-type regions 716 are relatively more heavily-doped than substrate 714 (e.g., silicon) to increase the threshold voltage of parasitic transistors, thereby improving the electrical isolation between neighboring transistors (not shown).

On exposure to a sufficient amount of ionizing radiation, however, the threshold voltage of the operating and parasitic transistor may shift by amounts such that the parasitic transistor will conduct when the operating transistor conducts. Moreover, a sufficient amount of ionizing radiation may cause the parasitic transistor to become an enhancement-mode device (i.e., conduct with zero potential difference between gate electrode 708 and source region 706). The reason for this shift in threshold voltage on exposure to ionizing radiation is explained below.

Threshold voltage is given theoretically by the equation:

$$V_T = \phi - (\sigma/\in)d - F \quad [1]$$

where: $\phi$ is the work function of the gate region;
$\sigma$ is the total charge at the dielectric(insulator)-semiconductor interface;
$\in$ is the dielectric constant of the insulator;
d is the insulator thickness;
F is a term that can be considered a constant.

If, somehow, positive interface charge, $\sigma$, is added, then threshold voltage, $V_T$, decreases (because a larger number is being subtracted from $\phi$). A decrease in threshold voltage makes a n-channel device (wherein conduction carriers are electrons) easier to "turn on." It can be seen from expression [1] that with sufficient positive interface charge, $\sigma$, an n-channel device can turn on at a threshold voltage, $V_T$, equal to zero. In fact, the addition of positive interface charge can occur on exposure to ionizing radiation.

When exposed to ionizing radiation, electron-hole pairs are formed in the gate dielectric and the field oxide. Some of the holes become trapped in the gate dielectric and field oxide as various gate-induced fields sweep out the electrons as part of normal circuit operation. Since holes behave like positive charge, this phenomenon is referred to as positive-charge trapping. The trapped "positive" charges migrate toward the silicon-silicon dioxide interface, thereby adding positive interface charge, σ, and, as a consequence, decreasing the threshold voltage, $V_T$.

A dielectric having a relatively greater thickness will trap more holes than a dielectric having a relatively lesser thickness. For example, field oxide 712 will trap more positive charge than gate dielectric 718 since it is significantly thicker (e.g., about 1000 angstroms versus about 70 angstroms). More positive interface charge will therefore be added at the field oxide (712)/semiconductor interface than at the gate dielectric (718)/semiconductor interface.

Since the field oxide "traps" more "positive" charge than the gate dielectric, and since the threshold voltage decreases as positive interface charge increases, the threshold voltage of the parasitic transistor at regions 720 will therefore shift downwardly more than will the threshold voltage of the operating transistor (i.e., the transistor having gate dielectric 718). If the dose of radiation is sufficiently great, the parasitic transistor will conduct at regions 720 (i.e., under the edge of field oxide 712) regardless of whether or not the operating transistor conducts.

In the context of the present invention, the isolation trenches (e.g., trenches 335) are significantly thicker than the gate dielectric and so they will trap more positive charge than the gate dielectric on exposure to ionizing radiation. In accordance with the mechanism described above, parasitic transistors formed at the interface of the side wall of the trench and the semiconductor will begin to conduct and a leakage current will result.

The mechanism described above occurs in high-quality oxides, which characteristically have a relatively low incidence of defects so that electron mobility is not impeded. HDPCVD produces such a high-quality oxide. On the other hand, in a poor-quality oxide, which is characterized by a relatively high incidence of defects, the mobility of electrons is impeded. As a consequence, fewer electrons are swept out of the silicon dioxide and those electrons that remain recombine with the holes (ie., charge cancellation). Therefore, holes do not accumulate at the interface, and leakage current (in any significant amount) is not observed. LPCVD and PECVD produce lower quality oxides than HDPCVD and will result, therefore, in more-radiation tolerant devices.

Several operating parameters (e.g., RF power to the antenna, RF bias to the wafer, gas flow, etc.) are used to control HDPCVD processes. Perhaps the most important is RF power to the antenna. As a guideline for the present invention, for high-frequency operation, RF power will typically be in the range of about 1800 to about 2200 watts, and, for low-frequency operation, RF power will typically be in the range of about 4000 to about 4500 watts. Those skilled in the art will know how to suitably adjust operating parameters to obtain high quality HDPCVD oxides as are required for use in conjunction with the present invention.

FIG. 6 depicts trenches 335 filled with insulating material 355A (radiation tolerant) or 355B (radiation intolerant), and shows the insulating material deposited over the surface of sacrificial layer 315, as well.

Following trench filling operations 250A and 250B, planarization of the wafer, which comprises a sequence of mask and etch steps, is required. As will be appreciated by those skilled in the art, different planarization processes are required as a function of the trench fill process (e.g., HDPCVD or LPCVD). Thus, in operation 260B, HDPCVD-filled trenches are planarized, and in operation 260A, LPCVD-filled trenches are planarized.

In operation 260, the insulating material is removed from regions of the wafer other than trenches 335 by etching and/or polishing. The sacrificial layer is then removed. The fabrication method converges at operation 260. By the completion of operation 260, trenches 335 have been formed, filled with insulating material 355A or 355B for providing a radiation-tolerant or radiation-intolerant circuit, as desired, and the wafer is ready for further processing operations (see FIG. 7).

Illustrative method 200 is advantageously used in conjunction with any of a variety of well-known processes for fabricating semiconductor devices, thereby providing an improved method for fabricating such devices.

By way of example, an improved method 400 for forming a FET is described below. It will be understood that in other embodiments, the inventive method is used to form other types of devices (e.g., bipolar transistors and other circuit elements). In those other embodiments, the trench-forming/filling sequence (ie., method 200) is repeated, typically as an initial step. Subsequent steps will of course vary with the device-type being formed. The same basic operations used in method 400 for forming a FET are, however, used in such other fabrication methods. In those other methods, the operations are appropriately re-sequenced and are performed using different materials. See, P. Van Zant, *Microchip, Fabrication: A Practical Guide to Semiconductor Processing*, previously referenced, for background regarding the manufacture of FETs and other semiconductor devices.

Figure 8:
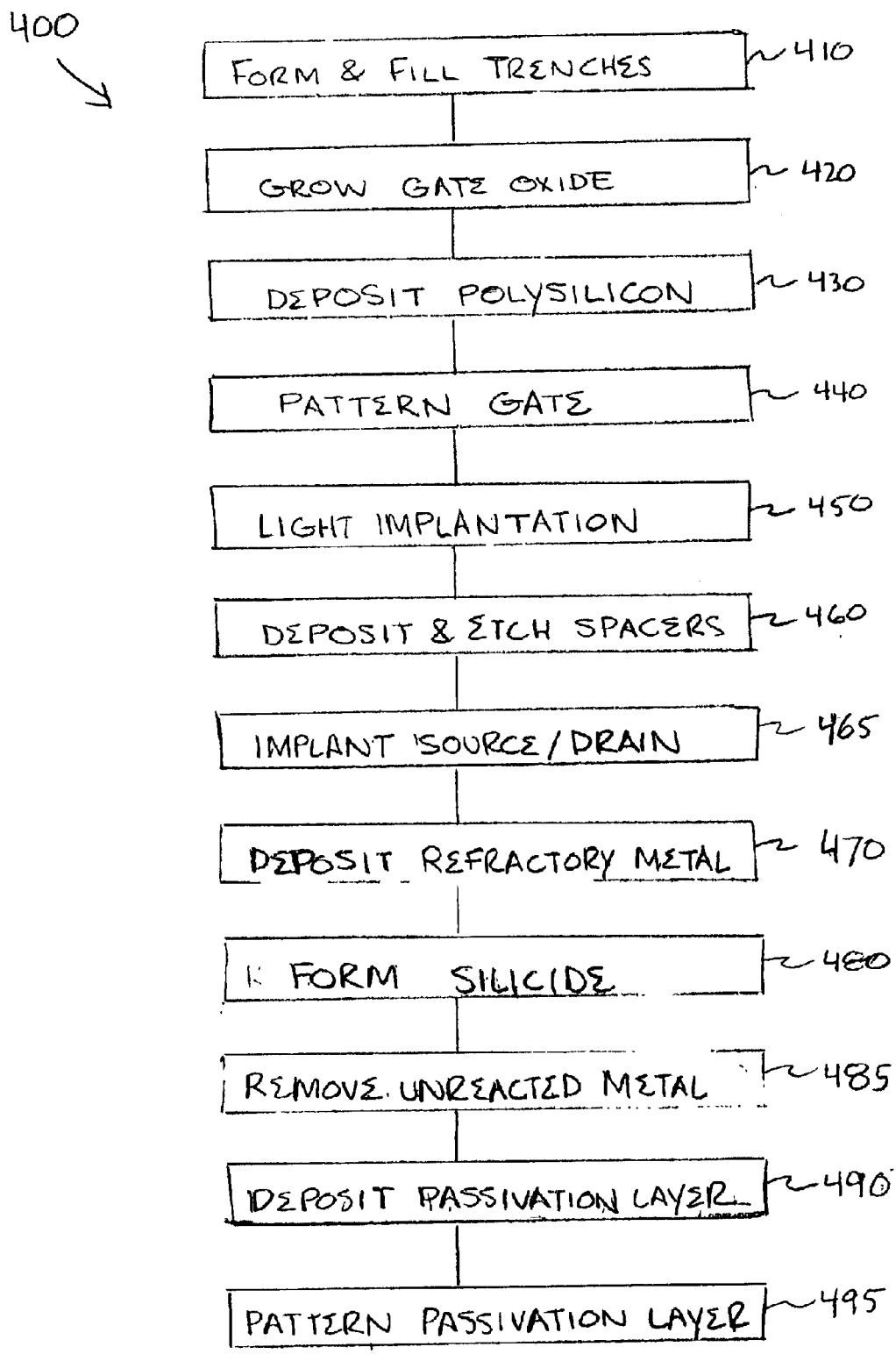
FIG. 8 depicts a flow diagram of one embodiment of a method for fabricating a FET in accordance with the present teachings.
Figure 9:
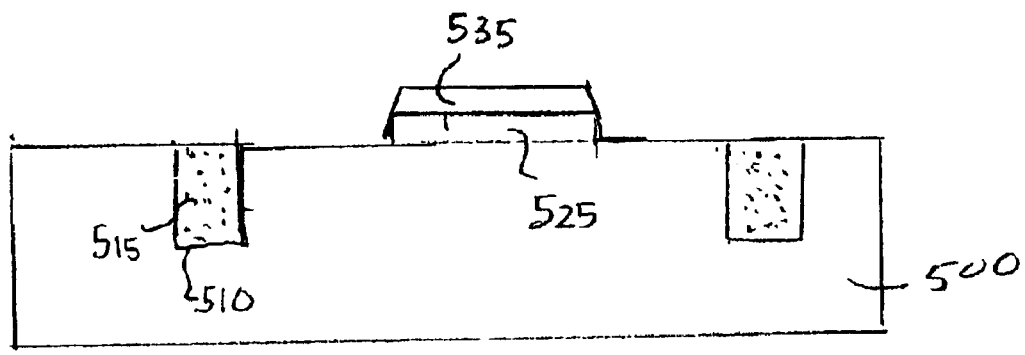
FIGS. 9–10 depict a cross-section of a wafer at various stages of fabrication in accordance with the illustrative method of FIG. 8.
Figure 10:
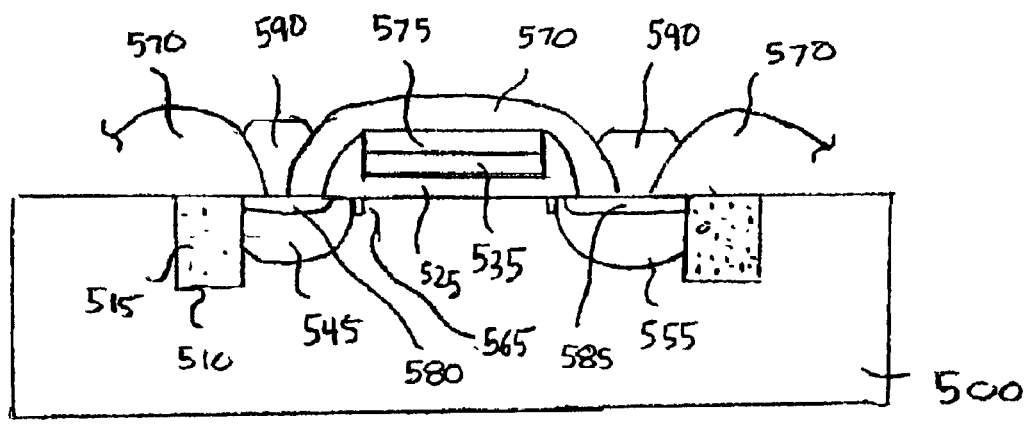

FIG. 8 depicts a method 400 for fabricating a FET 595 in accordance with the present teachings. FIGS. 9 and 10 depict a cross-section of wafer 500 at various stages of processing in accordance with method 400.

In one embodiment, method 400 begins with operations 210 through 260 of method 200 (see FIG. 2). Such operations are referenced collectively in the FIG. 8 flow diagram by the reference numeral "410."

In operation 410, trenches 510 are formed in wafer 500 and then filled with electrically-insulating material 515 (e.g., silicon dioxide, etc.). Electrically-insulating material 515 is either radiation-tolerant or radiation-intolerant as a function of operation specifics, as previously described. In operation 420, gate oxide 525 is grown, and then, in operation 430, a layer of polysilicon is deposited on gate oxide 525. The layer of polysilicon is patterned to form the transistor gate 535 in operation 440.

FIG. 9 depicts a cross-section of wafer 500 showing trenches 510 filled with electrically-insulating material 515, gate oxide 525 and gate 535.

Remaining operations in illustrative process 400 are directed to forming the well-known "salicide" gate structure. In operation 450, source 545 and drain 555 are lightly doped around the polysilicon gate 535. A layer of silicon dioxide is deposited and anisotropically (dry) etched to form spacers 560 on the "side" of gate 535 in operation 460. Spacers 560 function as ion-implantation masks for a subsequent "heavier" doping of source 545 and drain 555. Lightly-doped "fingers" 565 under gate 535, called a lightly-doped drain extension ("LDD") may suitably be used when channel lengths are less than about 0.5 microns. In operation 465, the doping of source 545 and drain 555 is completed.

In operation 470, refractory metal, such as titanium, cobalt, etc., is deposited. Silicide is formed in an alloying operation 480, wherein the deposited refractory metal reacts with underlying polysilicon (i.e., polysilicon gate 535). In operation 485, un-reacted refractory metal is removed from the wafer surface, via etching and/or polishing. A final layer of material 570, typically silicon dioxide, is layered over the existing features in operation 490. This layer is known as a "passivation" layer. The passivation layer serves to protect underlying features. In a final operation 495, the passivation layer is patterned to remove portions of the layer that overlie the electrical contact terminals.

FIG. 10 depicts a cross-section of wafer 500 showing the final structure of FET 595 having shallow trench isolation. Transistor 595 has a region 575 of silicide above gate 535, a region 580 of silicide in source 545, and a region 585 of silicide in drain 555. Electrical contacts 590 (fabrication not described), typically tungsten or aluminum, are in electrical contact with source 545 and drain 555.

For clarity of expression, method 400 is applied to the fabrication of a single transistor. It will be understood that the method is useful for fabricating many transistors during a production run. Moreover, along with transistors, other components (e.g, diodes, capacitors and resistors) will typically be required as part of a circuit design. Those components are advantageously fabricated with the transistors in well-known fashion.

The illustrative methods are implemented using a fabrication line. The fabrication line includes one or more processing stations each of which comprise one or more "processing systems." As used herein, the term "processing system" means devices, arrangements of devices, etc. that are capable of performing basic operations that are used to fabricate a semiconductor circuit. The term "processing station" refers to a region on the fabrication line at which such processing systems are located.

Examples of basic fabrication operations include, without limitation, layering (e.g., via oxidation and deposition techniques), patterning (e.g, via photolithographic and etching techniques), doping (e.g., via thermal diffusion and ion implantation) and heat treatment (e.g., via thermal and radiation processes). Since at least some of those operations are typically repeated several times during the manufacture of a circuit, the fabrication line should be physically adapted to allow a wafer to revisit various stations as appropriate.

Illustrative semiconductor-circuit fabrication line 600 capable of tailoring the total ionizing dose (TID) tolerance in accordance with the present invention is depicted figuratively in FIG. 11. Fabrication line 600 advantageously comprises a delivery system for delivering wafers to the various processing systems in the fabrication line.

In one embodiment, such a delivery system is realized by overhead rail or gantry 602 that is mechanically connected to a plurality of transfer lines 604. Gantry 602 receives a package (e.g., cassette) for transporting a plurality of wafers. Each transfer line 604 is near a processing station, such as station 610 (oxidation), station 620 (doping), stations 630A and 630B (deposition), station 640 (etching) and station 650 (photolithography). Thus, to deliver the package to a desired station, the package is directed along gantry 602 and then to the appropriate transfer line 604. It should be understood that in other embodiments, wafers are delivered to the processing stations by other arrangements and techniques, including, without limitation, manual delivery.

To form shallow trenches, the package is advanced along gantry 602 to the transfer line 604 adjacent to photolithography station 650. Photoresist is applied to the wafers and patterned at station 650, and then the package is moved back to gantry 602 and delivered to transfer line 604 adjacent to etch station 640. At station 640, trenches are etched, using a dry-etch technique, such as reactive ion etching (RIE). The processing systems that are used to form a trench in a wafer (ie., photolithography, etching, etc.) are referred to collectively herein as "trench-forming systems."

After etching, the package of wafers is returned to gantry 602. In the illustrated embodiment, if the circuits being formed are intended to be radiation tolerant, the package is directed to transfer line 604 adjacent deposition station 630A. Deposition station 630A advantageously uses LPCVD to deposit an electrically-insulating material, typically silicon dioxide, in the trenches. As previously described, when LPCVD is used to deposit the electrically-insulating material, the deposited material will be radiation tolerant.

Alternatively, if a radiation-intolerant circuit is desired, then the package is directed to transfer line 604 adjacent deposition station 630B. At deposition station 630B, electrically-insulating material is formed in the trenches using a deposition system or method that renders the electrically-insulating material radiation intolerant as previously described. HDPCVD is advantageously used for such purpose. HDPCVD-deposited material is radiation intolerant, yet, as previously described, has good fill characteristics.

After the trenches are prepared, processing continues according to the specifics of the particular application. Such processing will typically utilize the basic operations (e.g., doping—delivering dopant to a region of the wafer by known techniques; oxidation—growing an oxide via known techniques; photolithography; deposition and etching) provided by the processing systems that are located at the various stations of fabrication line 600. Other stations, such as, for example, a station for heat treatment, is included in the fabrication line in other embodiments, as desirable.

In some embodiments, multiple operations that might otherwise be carried out at multiple processing stations are grouped together at a single station for processing expediency. For example, in one embodiment, HDPCVD and LPCVD deposition apparatuses are situated at the same station.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

We claim:

1. A method for manufacturing circuits displaying different radiation tolerance properties, comprising:
   receiving at a fabrication line an indication of whether a radiation-tolerant or radiation-intolerant circuit is desired;
   forming a device-isolating trench in a wafer;
   selecting a deposition method for filling said trench based on said indication; and
   filling said trench with electrically insulating material using said deposition method.

2. The method of claim 1 comprising:
   forming a second device-isolating trench; and
   forming a transistor between said device-isolating trench and said second device-isolating trench.

3. The method of claim 2 wherein said transistor is a MOS transistor.

4. A method comprising:
   directing a wafer to a first system on a fabrication line to fill a trench in said wafer when a radiation-tolerant circuit is desired; and directing said wafer to a second system in said fabrication line to fill said trench when a radiation-intolerant circuit is desired.

5. The method of claim 4 wherein directing said wafer to said first system further comprises filling said trench with a dielectric material that is deposited via low-pressure chemical vapor deposition.

6. The method of claim 4 wherein directing said wafer to said second system further comprises filling said trench with a dielectric material that is deposited via high-density plasma chemical vapor deposition.

7. The method of claim 4 further comprising forming said trench in said wafer.

8. The method of claim 7 wherein forming said trench further comprises delivering said wafer to trench forming systems on said fabrication line.

9. The method of claim 8 wherein said trench forming systems comprise a photolithography system and an etching system.

10. The method of claim 8 wherein delivering said wafer further comprises transporting said wafer with a gantry.

11. The method of claim 4 wherein said first system comprises a low pressure chemical vapor deposition system.

12. The method of claim 4 wherein said second system comprises a high-density plasma chemical vapor deposition.

13. The method of claim 11 wherein said second system comprises a high-density plasma chemical vapor deposition.

14. A method comprising:
  making a determination whether a radiation tolerant circuit or a radiation intolerant circuit is to be fabricated on a wafer; and
  directing said wafer to one or another of two deposition systems depending upon said determination, wherein:
    said wafer is directed to a deposition system selected from the group consisting of a low-pressure chemical vapor deposition system and a plasma-enhanced chemical vapor deposition system when said determination is that a radiation tolerant circuit is to be fabricated; and
    said wafer is directed to a high-density plasma chemical vapor deposition system when said determination is that a radiation intolerant circuit is to be fabricated.

15. The method of claim 14 further comprising filling a trench in said wafer using said deposition system that said wafer is directed to.

16. The method of claim 1 wherein said indication is a requirement for a radiation-tolerant circuit and said deposition method is low-pressure chemical vapor deposition (LPCVD).

17. The method of claim 1 wherein said indication is a requirement for a radiation-tolerant circuit and said deposition method is plasma-enhanced chemical vapor deposition (PECVD).

18. The method of claim 1 wherein said indication is a requirement for a radiation-intolerant circuit and said deposition method is high-density plasma chemical vapor deposition (HDPCVD).

* * * * *

UNITED STATES PATENT AND TRADEMARK OFFICE
CERTIFICATE OF CORRECTION

PATENT NO. : 6,762,128 B2
DATED : July 13, 2004
INVENTOR(S) : Brady et al.

It is certified that error appears in the above-identified patent and that said Letters Patent is hereby corrected as shown below:

<u>Title page,</u>
Item [73], Assignee, should be changed from "BAE Systems" to -- BAE Systems Information and Electronic Systems Integration Inc. --.

Signed and Sealed this

Twenty-third Day of August, 2005

JON W. DUDAS
*Director of the United States Patent and Trademark Office*